US009054927B2

(12) United States Patent
Atungsiri et al.

(10) Patent No.: US 9,054,927 B2
(45) Date of Patent: Jun. 9, 2015

(54) DATA PROCESSING APPARATUS AND METHOD FOR USE IN AN INTERLEAVER SUITABLE FOR MULTIPLE OPERATING MODES

(71) Applicant: Sony Corporation, Tokyo (JP)

(72) Inventors: Samuel Asanbeng Atungsiri, Basingstoke (GB); Matthew Paul Athol Taylor, Ringwood (GB); John Nicholas Wilson, Hook (GB)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 14/531,236

(22) Filed: Nov. 3, 2014

(65) Prior Publication Data

US 2015/0049838 A1   Feb. 19, 2015

Related U.S. Application Data

(60) Division of application No. 14/078,159, filed on Nov. 12, 2013, now Pat. No. 8,891,691, which is a division of application No. 13/615,732, filed on Sep. 14, 2012, now Pat. No. 8,619,890, which is a continuation of application No. 12/740,014, filed as application No. PCT/GB2008/003606 on Oct. 24, 2008, now Pat. No. 8,306,137.

(30) Foreign Application Priority Data

Oct. 30, 2007   (GB) .................................. 0721269.9
Nov. 16, 2007   (GB) .................................. 0722553.5
Nov. 19, 2007   (GB) .................................. 0722645.9
Nov. 20, 2007   (GB) .................................. 0722728.3

(51) Int. Cl.
*H04L 27/00*     (2006.01)
*H04L 27/26*     (2006.01)
(Continued)

(52) U.S. Cl.
CPC .......... *H04L 27/2602* (2013.01); *H04L 1/0071* (2013.01); *H04L 5/0007* (2013.01)

(58) Field of Classification Search
CPC ...... H04L 1/0071; H04L 5/0007; H04L 27/14
USPC .................... 375/295, 260, 230, 340; 455/59; 370/203
See application file for complete search history.

(56) References Cited

U.S. PATENT DOCUMENTS 6,304,985 B1   10/2001   Sindhushayana et al.
6,314,534 B1   11/2001   Agrawal et al.
(Continued)

FOREIGN PATENT DOCUMENTS

CN   85 1 01066 A   1/1987
EP   1 463 255 A1   9/2004
(Continued)

OTHER PUBLICATIONS

"Digital Video Broadcasting (DVB)", ETS 300 744, pp. 25-34, (Mar. 1, 1997) XP002195640.
(Continued)

*Primary Examiner* — Juan A Torres
(74) *Attorney, Agent, or Firm* — Oblon, McClelland, Maier & Neustadt, L.L.P.

(57) ABSTRACT

A data processing apparatus maps input symbols to be communicated onto a predetermined number of sub-carrier signals of an Orthogonal Frequency Division Multiplexed (OFDM) symbol. The data processor includes an interleaver memory which reads-in the predetermined number of data symbols for mapping onto the OFDM sub-carrier signals. The interleaver memory reads-out the data symbols on to the OFDM sub-carriers to effect the mapping, the read-out being in a different order than the read-in, the order being determined from a set of addresses, with the effect that the data symbols are interleaved on to the sub-carrier signals. The set of addresses are generated from an address generator which comprises a linear feedback shift register and a permutation circuit.

16 Claims, 12 Drawing Sheets

(51) Int. Cl.
*H04L 1/00* (2006.01)
*H04L 5/00* (2006.01)

(56) References Cited

U.S. PATENT DOCUMENTS

| | | |
|---|---|---|
| 6,353,900 B1 | 3/2002 | Sindhushayana et al. |
| 6,625,234 B1 | 9/2003 | Cui et al. |
| 7,543,197 B2 | 6/2009 | Palanki et al. |
| 2002/0186797 A1 | 12/2002 | Robinson |
| 2004/0246888 A1 | 12/2004 | Peron |
| 2005/0008084 A1 | 1/2005 | Zhidkov |
| 2006/0062314 A1 | 3/2006 | Palin et al. |
| 2006/0123323 A1 | 6/2006 | Kim et al. |
| 2006/0256708 A1 | 11/2006 | Wang et al. |
| 2006/0282712 A1 | 12/2006 | Argon et al. |
| 2007/0139428 A1 | 6/2007 | Berkeman |
| 2008/0298487 A1 | 12/2008 | Peron |
| 2009/0300300 A1 | 12/2009 | Treigherman |
| 2015/0003559 A1 | 1/2015 | Peron et al. |

FOREIGN PATENT DOCUMENTS

| | | |
|---|---|---|
| EP | 1 463 256 A1 | 9/2004 |
| WO | 2005/091509 A1 | 9/2005 |

OTHER PUBLICATIONS

De Vile, Jonathan, "Reply to examination report Letter for EP1463256", pp. 1-4 (Aug. 2, 2005).

Afshari, "A Novel Symbol Interleaver Address Generation Architecture for DVB-T Modulator" International Symposium on Communications and Information Technologies, 2006, ISCIT '06, Publication Year: 2006, pp. 989-993.

Taiwanese Office Action issued Dec. 27, 2013, in Taiwan Patent Application No. 097140957 (with English translation of Category of Cited Documents).

U.S. Appl. No. 14/487,963, filed Sep. 16, 2014, Peron, et al.
U.S. Appl. No. 14/531,236, filed Nov. 3, 2014, Atungsiri, et al.
U.S. Appl. No. 14/538,917, filed Nov. 12, 2014, Taylor, et al.

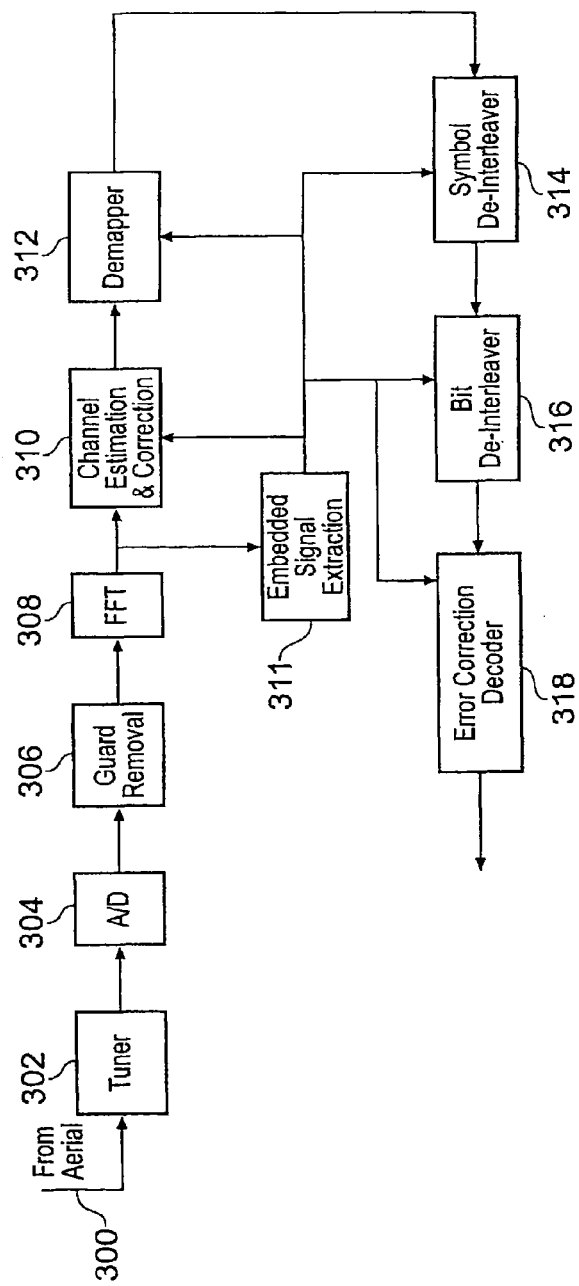
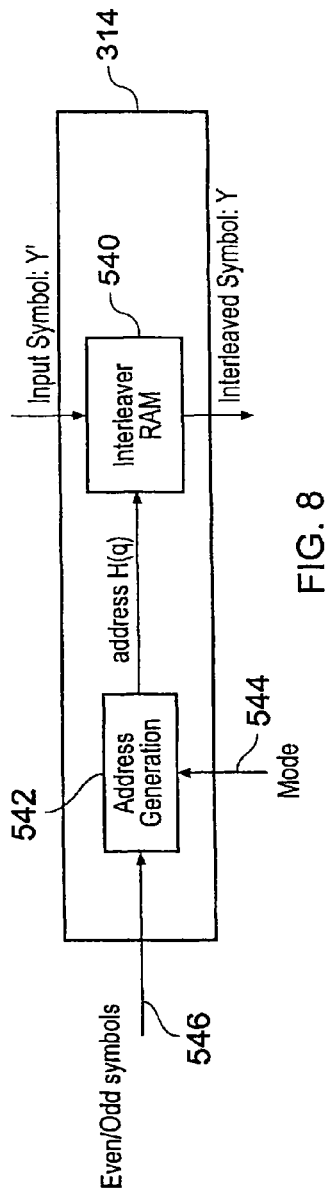
FIG. 7
FIG. 8

DATA PROCESSING APPARATUS AND METHOD FOR USE IN AN INTERLEAVER SUITABLE FOR MULTIPLE OPERATING MODES

CROSS-REFERENCE TO RELATED APPLICATIONS

The present application is a divisional application of U.S. application Ser. No. 14/078,159, filed Nov. 12, 2013, which is a divisional application of U.S. application Ser. No. 13/615,732, filed Sep. 14, 2012, (now U.S. Pat. No. 8,619,890) which is a continuation application of U.S. Ser. No. 12/740,014, filed Jul. 12, 2010, (now U.S. Pat. No. 8,306,137) the entire contents of which are incorporated herein by reference. U.S. Ser. No. 12/740,014 is a National Stage application of PCT/GB08/03606, filed Oct. 24, 2008, and claims priority to GB0721269.9, filed Oct. 30, 2007, GB0722553.5, filed Nov. 16, 2007, GB0722645.9, filed Nov. 19, 2007, and GB0722728.3, filed Nov. 20, 2007.

FIELD OF INVENTION

The present invention relates to data processing apparatus operable to map input symbols onto sub-carrier signals of an Orthogonal Frequency Division Multiplexed (OFDM) symbol. The present invention also relates to an address generator for use in writing symbols to/reading symbols from an interleaver memory.

The present invention also relates to data processing apparatus operable to map symbols received from a predetermined number of sub-carrier signals of an OFDM symbol into an output symbol stream.

Embodiments of the present invention can provide an OFDM transmitter/receiver.

BACKGROUND OF THE INVENTION

The Digital Video Broadcasting-Terrestrial standard (DVB-T) utilises Orthogonal Frequency Division Multiplexing (OFDM) to communicate data representing video images and sound to receivers via a broadcast radio communications signal. There are known to be two modes for the DVB-T standard which are known as the 2k and the 8k mode. The 2k mode provides 2048 sub-carriers whereas the 8k mode provides 8192 sub-carriers. Similarly for the Digital Video Broadcasting-Handheld standard (DVB-H) a 4k mode has been provided, in which the number of sub-carriers is 4096.

In order to improve the integrity of data communicated using DVB-T or DVB-H a symbol interleaver is provided in order to interleave input data symbols as these symbols are mapped onto the sub-carrier signals of an OFDM symbol. Such a symbol interleaver comprises an interleaver memory in combination with an address generator. The address generator generates an address for each of the input symbols, each address indicating one of the sub-carrier signals of the OFDM symbol onto which the data symbol is to be mapped. For the 2k mode and the 8k mode an arrangement has been disclosed in the DVB-T standard for generating the addresses for the mapping. Likewise for the 4k mode of the DVB-H standard, an arrangement for generating addresses for the mapping has been provided and an address generator for implementing this mapping is disclosed in European Patent application 04251667.4. The address generator comprises a linear feed back shift register which is operable to generate a pseudo random bit sequence and a permutation circuit. The permutation circuit permutes the order of the content of the linear feed back shift register in order to generate an address. The address provides an indication of one of the OFDM sub-carriers for carrying an input data symbol stored in the interleaver memory, in order to map the input symbols onto the sub-carrier signals of the OFDM symbol.

In accordance with a further development of the Digital Video Broadcasting-Terrestrial broadcasting standard, known as DVB-T2 there has been proposed that further modes for communicating data be provided.

SUMMARY OF INVENTION

According to an aspect of the present invention there is provided a data processing apparatus operable to map input symbols to be communicated onto a predetermined number of sub-carrier signals of an Orthogonal Frequency Division Multiplexed (OFDM) symbol. The data processing apparatus comprises an interleaver operable to read-into a memory the predetermined number of data symbols for mapping onto the OFDM sub-carrier signals, and to read-out of the memory the data symbols for the OFDM sub-carriers to effect the mapping. The read-out is in a different order than the read-in, the order being determined from a set of addresses, with the effect that the data symbols are interleaved on the sub-carrier signals. The set of addresses is determined by an address generator, an address being generated for each of the input symbols to indicate one of the sub-carrier signals onto which the data symbol is to be mapped.

The address generator comprises a linear feedback shift register including a predetermined number of register stages and is operable to generate a pseudo-random bit sequence in accordance with a generator polynomial, and a permutation circuit and a control unit. The permutation circuit is operable to receive the content of the shift register stages and to permute the bits present in the register stages in accordance with a permutation order to form an address of one of the OFDM sub-carriers.

The control unit is operable in combination with an address check circuit to re-generate an address when a generated address exceeds a predetermined maximum valid address. The data processing apparatus is characterised in that the predetermined maximum valid address is approximately five hundred, the linear feedback shift register has eight register stages with a generator polynomial for the linear feedback shift register of $R'_i[7]=R'_{i-1}[0] \oplus R'_{i-1}[1] \oplus R'_{i-1}[5] \oplus R'_{i-1}[6]$, and the permutation order forms, with an additional bit, a nine bit address $R_i[n]$ for the i-th data symbol from the bit present in the n-th register stage $R'_i[n]$ in accordance with the table:

| $R'_i$ bit positions | 7 | 6 | 5 | 4 | 3 | 2 | 1 | 0 |
|---|---|---|---|---|---|---|---|---|
| $R_i$ bit positions | 3 | 7 | 4 | 6 | 1 | 2 | 0 | 5 |

Although it is known within the DVB-T standard to provide the 2k mode and the 8k mode, and the DVB-H standard provides a 4k mode, it would be beneficial to provide a 0.5k mode interleaver for DVB-T2. The lower the order of the mode, the more frequently the channel estimation can be updated allowing the receiver to track the time variation of the channel due to doppler and other effects more accurately. In some embodiments, the present invention can provide a data processing apparatus operable as a symbol interleaver for mapping data symbols to be communicated on an OFDM symbol, having substantially five hundred sub-carrier signals.

In other embodiments, the present invention can provide a data processing apparatus operable as a symbol interleaver for mapping data symbols to be communicated on an OFDM symbol having substantially one thousand sub-carrier signals wherein the data symbols are mapped as pairs onto adjacent sub carriers forming pairs of sub-carriers. This embodiment would allow the interleaving of pairs of input symbols onto pairs of sub-carriers in a 1k mode.

Furthermore, the OFDM symbol may include pilot sub-carriers, which are arranged to carry known symbols, and the predetermined maximum valid address depends on the number of the pilot sub-carrier symbols present in the OFDM symbol. In some examples the predetermined maximum valid address may vary between three hundred and substantially five hundred and twelve, for example three hundred and seventy eight. As such the 0.5k mode interleaver can be provided for example for a DVB standard, such as DVB-T2.

Mapping data symbols to be transmitted onto the sub-carrier signals of an OFDM symbol, where the number of sub-carrier signals is approximately five hundred, represents a technical problem requiring simulation analysis and testing to establish an appropriate generator polynomial for the linear feedback shift register and the permutation order. This is because the mapping requires that the symbols are interleaved onto the sub-carrier signals with the effect that successive symbols from the input data stream are separated in frequency by a greatest possible amount in order to optimise the performance of error correction coding schemes.

Error correction coding schemes such as Low Density Parity Check/Bose-Chaudhuri-Hocquengham (LDPC/BCH) coding, which has been proposed for DVB-T2 perform better when noise and degradation of the symbol values resulting from communication is un-correlated. Terrestrial broadcast channels may suffer from correlated fading in both the time and the frequency domains. As such by separating encoded symbols on to different sub-carrier signals of the OFDM symbol by as much as possible, the performance of error correction coding schemes can be increased.

As will be explained, it has been discovered from simulation performance analysis that the generator polynomial for the linear feed back shift register in combination with the permutation circuit order indicated above, provides a good performance. Furthermore, by providing an arrangement which can implement address generating for each of the 1k mode, 2k mode, the 4k mode, the 8k mode, the 16k mode and the 32k mode by changing the taps of the generator polynomial for the linear feed back shift register and the permutation order, a cost effective implementation of the 0.5k mode symbol interleaver can be provided. Furthermore, a transmitter and a receiver can be changed between the 0.5k mode, 1k mode, 2k mode, 4k mode, 8k mode, 16k mode and the 32k mode by changing the generator polynomial and the permutation orders. This can be effected in software (or by the embedded signalling) whereby a flexible implementation is provided.

The additional bit, which is used to form the address from the content of the linear feedback shift register, may be produced by a toggle circuit, which changes from 1 to 0 for each address, so as to reduce a likelihood that if an address exceeds the predetermined maximum valid address, then the next address will be a valid address. In one example the additional bit is the most significant bit.

Various aspects and features of the present invention are defined in the appended claims. Further aspects of the present invention include a data processing apparatus operable to map symbols received from a predetermined number of sub-carrier signals of an Orthogonal Frequency Division Multiplexed (OFDM) symbol into an output symbol stream, as well as a transmitter and a receiver.

BRIEF DESCRIPTION OF DRAWINGS

Embodiments of the present invention will now be described by way of example only with reference to the accompanying drawings, wherein like parts are provided with corresponding reference numerals, and in which:

FIG. 6(a) is diagram illustrating results for an interleaver using the address generator shown in FIG. 5 for even symbols and FIG. 6(b) is a diagram illustrating design simulation results for odd symbols, whereas

FIG. 7 is a schematic block diagram of a Coded OFDM receiver which may be used, for example, with the DVB-T2 standard; and FIG. 8 is a schematic block diagram of a symbol de-interleaver which appears in FIG. 7;

DESCRIPTION OF PREFERRED EMBODIMENTS

It has been proposed that the number of modes, which are available within the DVB-T2 standard should be extended to include a 1k mode, a 16k mode and a 32k mode. It has also been proposed to provide a 0.5k mode interleaver for interleaving pairs of input data symbols onto pairs of sub-carrier signals for a 1k mode system or for providing an interleaver for a 0.5k mode system. The following description is provided to illustrate the operation of a symbol interleaver in accordance with the present technique, although it will be appreciated that the symbol interleaver can be used with other modes and other DVB standards.

Figure 1:
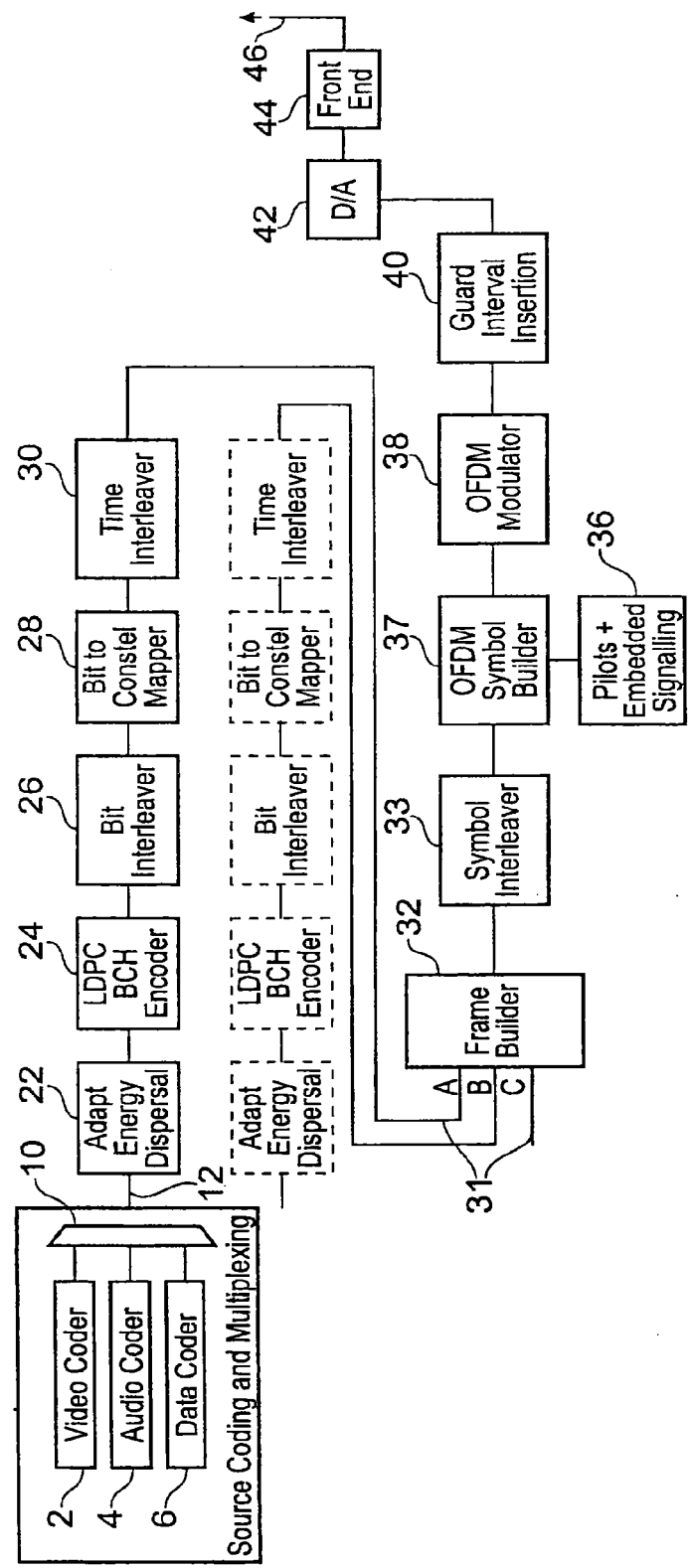
FIG. 1 is a schematic block diagram of a Coded OFDM transmitter which may be used, for example, with the DVB-T2 standard.

FIG. 1 provides an example block diagram of a Coded OFDM transmitter 1 which may be used for example to transmit video images and audio signals in accordance with the DVB-T2 standard. In FIG. 1 a program source generates data to be transmitted by the Coded Orthogonal Frequency Division Multiplexing (COFDM) transmitter. A video coder 2, and audio coder 4 and a data coder 6 generate video, audio and other data to be transmitted which are fed to a program multiplexer 10. The output of the program multiplexer 10 forms a multiplexed stream with other information required to communicate the video, audio and other data. The multiplexer 10 provides a stream on a connecting channel 12. There may be many such multiplexed streams which are fed into different branches A, B etc. For simplicity, only branch A will be described.

As shown in FIG. 1 a COFDM transmitter receives the stream at a multiplexer adaptation and energy dispersal block 22. The multiplexer adaptation and energy dispersal block 22 randomises the data and feeds the appropriate data to a forward error correction encoder 24 which performs error correction encoding of the stream. A bit interleaver 26 is provided to interleave the encoded data bits which for the example of DVB-T2 is the LDCP/BCH encoder output. The output from the bit interleaver 26 is fed to a bit to constellation mapper 28, which maps groups of bits onto a constellation point, which is to be used for conveying the encoded data bits. The outputs from the bit to constellation mapper 28 are constellation point labels that represent real and imaginary components. The constellation point labels represent data symbols formed from two or more bits depending on the modulation scheme used. These will be referred to as data cells. These data cells are passed through a time-interleaver 30 whose effect is to interleaver data cells resulting from multiple LDPC code words.

The data cells are received by a frame builder 32, with data cells produced by branch B etc in FIG. 1, via other channels 31. The frame builder 32 then forms many data cells into sequences to be conveyed on COFDM symbols, where a COFDM symbol comprises a number of data cells, each data cell being mapped onto one of the sub-carriers. The number of sub-carriers will depend on the mode of operation of the system, which may include one of 0.5k 1k, 2k, 4k, 8k, 16k or 32k, each of which provides a different number of sub-carriers according, for example to the following table:

| Mode | Preferred number of sub-carriers |
|---|---|
| 0.5k | 378 |
| 1k | 756 |
| 2k | 1512 |
| 4k | 3024 |
| 8k | 6048 |
| 16k | 12096 |
| 32k | 24192 |

Number of Sub-carriers Adapted from DVB-T/H

In some embodiments, for example those operating CODFM schemes adapted from DVB-T/H, the preferred number of carriers per mode is shown in the "Preferred number of sub carriers" column in the table above. However it will be appreciated that the number of sub-carriers for a given mode can vary depending on the requirements of the particular DVB scheme being employed. Each mode will have a maximum number of carriers which will vary for example in accordance with the number of pilot carriers.

It will be understood that in some examples substantially five hundred may refer to three hundred and seventy eight.

Each frame comprises many such COFDM symbols. The sequence of data cells to be carried in each COFDM symbol is then passed to the symbol interleaver 33. The COFDM symbol is then generated by a COFDM symbol builder block 37 which uses the constellation data labels to generate the real and imaginary parts of the constellation points and also introducing pilot and synchronising signals fed from a pilot and embedded signal former 36. An OFDM modulator 38 then forms the OFDM symbol in the time domain which is fed to a guard insertion processor 40 for generating a guard interval between symbols, and then to a digital to analogue convertor 42 and finally to an RF amplifier within an RF front 44 for eventual broadcast by the COFDM transmitter from an antenna 46.

Providing a 0.5k Mode Interleaver

As mentioned above, the 0.5k interleaver can be used to interleave input data cells onto OFDM sub-carriers of an OFDM system operating in a 0.5k mode. Additionally, the 0.5k interleaver could be used to interleave pairs of input data cells on to pairs of adjacent OFDM sub-carriers in a 1k mode system.

To create a 0.5k mode interleaver, several elements are to be defined, one of which, of course, is the 0.5k symbol interleaver 33 itself. The bit to constellation mapper 28, symbol interleaver 33 and the frame builder 32 are shown in more detail in FIG. 2.

As explained above, the present invention provides a facility for providing a quasi-optimal mapping of the data symbols onto the OFDM sub-carrier signals. According to the example technique the symbol interleaver is provided to effect the optimal mapping of input data symbols onto COFDM sub-carrier signals in accordance with a permutation code and generator polynomial, which has been verified by simulation analysis.

Figure 2:
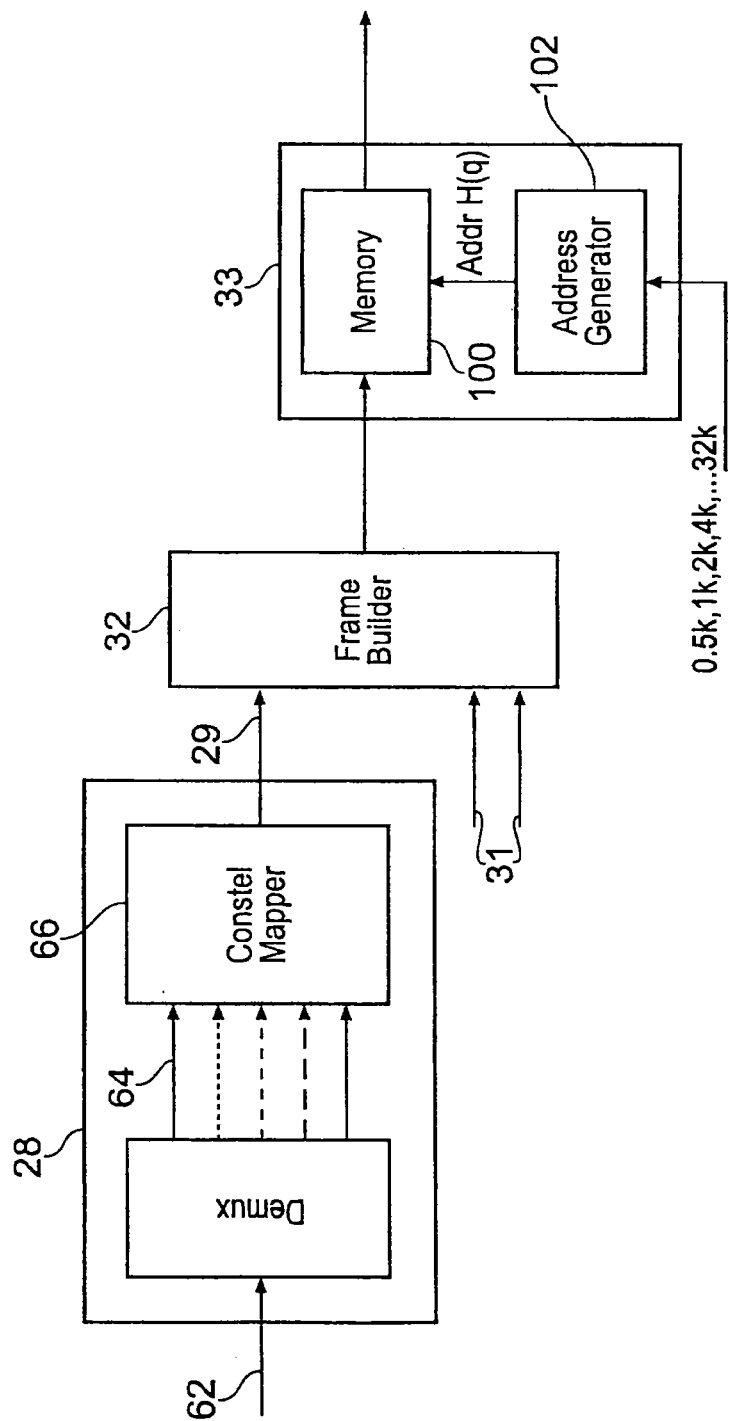
FIG. 2 is a schematic block diagram of parts of the transmitter shown in FIG. 1 in which a symbol mapper and a frame builder illustrate the operation of an interleaver.

As shown in FIG. 2 a more detailed example illustration of the bit to symbol constellation mapper 28 and the frame builder 32 is provided to illustrate an example embodiment of the present technique. Data bits received from the bit interleaver 26 via a channel 62 are grouped into sets of bits to be mapped onto a data cell, in accordance with a number of bits per symbol provided by the modulation scheme. The groups of bits, which forms a data word, are fed in parallel via data channels 64 to a mapping processor 66. The mapping processor 66 then selects one of the data symbols, in accordance with a pre-assigned mapping. The constellation point, is represented by a real and an imaginary component but only its label is provided to the output channel 29 as one of a set of inputs to the frame builder 32.

The frame builder 32 receives the data cells from the bit to constellation mapper 28 through channel 29, together with data cells from the other channels 31. After building a frame of many COFDM cell sequences, in one embodiment in order to facilitate the 0.5k mode, the cells of each COFDM symbol are then written into an interleaver memory 100 and read out of the interleaver memory 100 in accordance with write addresses and read addresses generated by an address generator 102. Alternatively in another embodiment for interleaving pairs of input data symbols on to pairs of sub-carriers in the 1k mode, pairs of cells of the COFDM symbols are written into the interleaver memory 100 and read out of the interleaver memory 100 in accordance with write addresses and read addresses generated by an address generator 102. According to the write-in and read-out order, interleaving of the data cells is achieved, by generating appropriate addresses. The operation of the address generator 102 and the interleaver memory 100 will be described in more detail shortly with reference to FIGS. 3, 4 and 5. The interleaved data cells are then mapped to real and imaginary components of data symbols, which are combined with pilot and synchronisation symbols received from the pilot and embedded signalling former 36 into an OFDM symbol builder 37, to form the COFDM symbol, which is fed to the OFDM modulator 38 as explained above.

Figure 3:
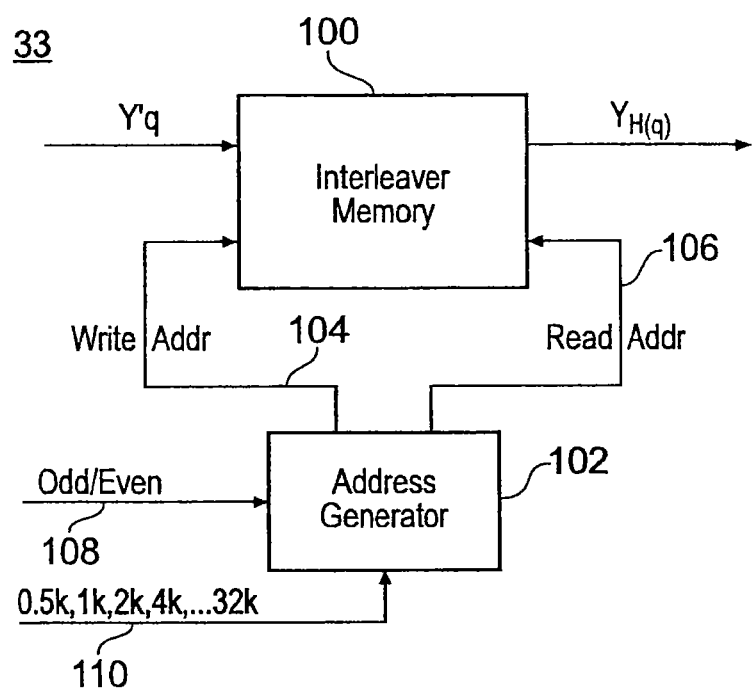
FIG. 3 is a schematic block diagram of the symbol interleaver shown in FIG. 2.

FIG. 3 provides an example of parts of the symbol interleaver 33, which illustrates the present technique for interleaving symbols. In FIG. 3 the input data cells from the frame builder 32 are written into the interleaver memory 100. The data cells are written into the interleaver memory 100 according to a write address fed from the address generator 102 on channel 104, and read out from the interleaver memory 100 according to a read address fed from the address generator 102 on a channel 106. The address generator 102 generates the write address and the read address as explained below, depending on whether the COFDM symbol is odd or even, which is identified from a signal fed from a channel 108, and depending on a selected mode, which is identified from a signal fed from a channel 110. As explained, the mode can be one of a 0.5k mode, 1k mode, 2k mode, 4k mode, 8k mode, 16k mode or a 32k mode. As explained below, the write address and the read address are generated differently for odd and even symbols as explained with reference to FIG. 4, which provides an example implementation of the interleaver memory 100.

Figure 4:
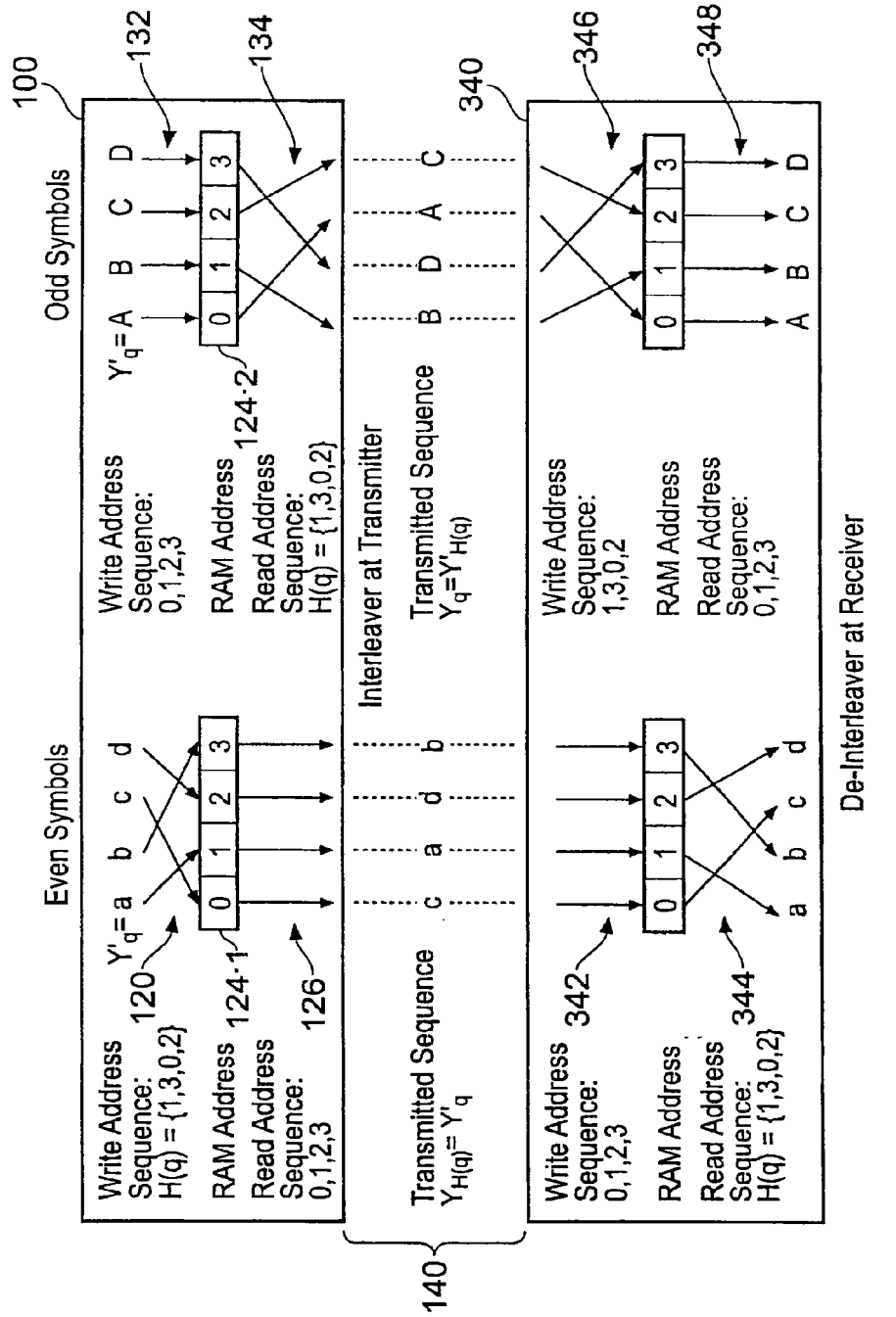
FIG. 4 is a schematic block diagram of an interleaver memory shown in FIG. 3 and the corresponding symbol de-interleaver in the receiver.

In the example shown in FIG. 4, the interleaver memory is shown to comprise an upper part 100 illustrating the operation of the interleaver memory in the transmitter and a lower part 340, which illustrates the operation of the de-interleaver memory in the receiver. The interleaver 100 and the de-interleaver 340 are shown together in FIG. 4 in order to facilitate understanding of their operation. As shown in FIG. 4 a representation of the communication between the interleaver 100 and the de-interleaver 340 via other devices and via a transmission channel has been simplified and represented as a section 140 between the interleaver 100 and the de-interleaver 340. The operation of the interleaver 100 is described in the following paragraphs:

Although FIG. 4 provides an illustration of only four input data cells onto an example of four sub-carrier signals of a COFDM symbol, it will be appreciated that the technique illustrated in FIG. 4 can be extended to a larger number of sub-carriers such as 378 for the 0.5k mode, 756 for the 1k mode 1512 for the 2k mode, 3024 for the 4k mode and 6048 for the 8k mode, 12096 for the 16k mode and 24192 for the 32k mode, or can be adapted to interleave pairs of data cells onto pairs of sub-carriers as discussed above.

The input and output addressing of the interleaver memory 100 shown in FIG. 4 is shown for odd and even symbols. For an even COFDM symbol the data cells are taken from the input channel and written into the interleaver memory 124.1 in accordance with a sequence of addresses 120 generated for each COFDM symbol by the address generator 102. The write addresses are applied for the even symbol so that as illustrated interleaving is effected by the shuffling of the write-in addresses. Therefore, for each interleaved symbol $y(h(q))=y'(q)$.

For odd symbols the same interleaver memory 124.2 is used. However, as shown in FIG. 4 for the odd symbol the write-in order 132 is in the same address sequence used to read out the previous even symbol 126. This feature allows the odd and even symbol interleaver implementations to only use one interleaver memory 100 provided the read-out operation for a given address is performed before the write-in operation. The data cells written into the interleaver memory 124.2 during odd symbols are then read out in a sequence 134 generated by the address generator 102 for the next even COFDM symbol and so on. Thus only one address is generated per symbol, with the read-in and write-out for the odd/even COFDM symbol being performed contemporaneously.

In summary, as represented in FIG. 4, once the set of addresses H(q) has been calculated for all active sub-carriers, the input vector $Y'=(y_0', y_1', y_2', \ldots y_{Nmax-1}')$ is processed to produce the interleaved vector $Y=(y_0, y_1, y_2, \ldots y_{Nmax-1})$ defined by:

$$y_{H(q)}=y'_q \text{ for even symbols for } q=0, \ldots, N_{max}-1$$

$$y_q=y'_{H(q)} \text{ for odd symbols for } q=0, \ldots, N_{max}-1$$

In other words, for even OFDM symbols the input words are written in a permutated way into a memory and read back in a sequential way, whereas for odd symbols, they are written sequentially and read back permutated. In the above case, the permutation H(q) is defined by the following table:

TABLE 1

| permutation for simple case where Nmax = 4 | | | | |
|---|---|---|---|---|
| | q | | | |
| | 0 | 1 | 2 | 3 |
| H(q) | 1 | 3 | 0 | 2 |

As shown in FIG. 4, the de-interleaver 340 operates to reverse the interleaving applied by the interleaver 100, by applying the same set of addresses as generated by an equivalent address generator, but applying the write-in and read-out addresses in reverse. As such, for even symbols, the write-in addresses 342 are in sequential order, whereas the read out address 344 are provided by the address generator. Correspondingly, for the odd symbols, the write-in order 346 is determined from the set of addresses generated by the address generator, whereas read out 348 is in sequential order.

Address Generation for the 0.5k Mode Interleaver

Figure 5:
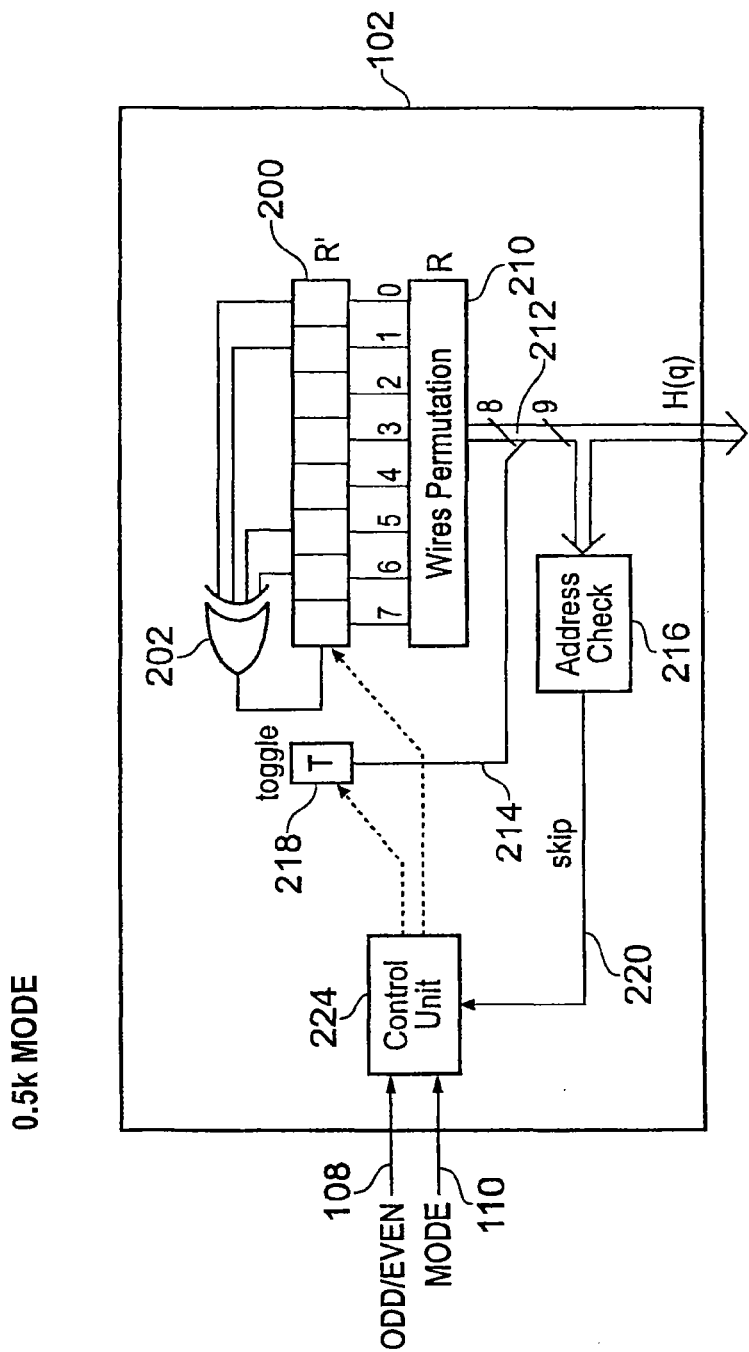
FIG. 5 is a schematic block diagram of an address generator shown in FIG. 3 for the 0.5k mode interleaver.

A schematic block diagram of the algorithm used to generate the permutation function H(q) is represented in FIG. 5 for the 0.5k mode interleaver.

An implementation of the address generator 102 for the 0.5k mode interleaver is shown in FIG. 5. In FIG. 5 a linear feed back shift register is formed by eight register stages 200 and a xor-gate 202 which is connected to the stages of the shift register 200 in accordance with a generator polynomial. Therefore, in accordance with the content of the shift register 200 a next bit of the shift register is provided from the output of the xor-gate 202 by xoring the content of shift registers R[0], R[1], R[5], R[6] according to the generator polynomial:

$$R'_i[7]=R'_{i-1}[0]\oplus R'_{i-1}[1]\oplus R'_{i-1}[5]\oplus R'_{i-1}[6]$$

According to the generator polynomial a pseudo random bit sequence is generated from the content of the shift register 200. However, in order to generate an address for the 0.5k mode interleaver as illustrated, a permutation circuit 210 is provided which effectively permutes the order of the bits within the shift register 200 from an order $R'_i[n]$ to an order $R_i[n]$ at the output of the permutation circuit 210. Eight bits from the output of the permutation circuit 210 are then fed on a connecting channel 212 to which is added a most significant bit via a channel 214 which is provided by a toggle circuit 218. A nine bit address is therefore generated on channel 212. However, in order to ensure the authenticity of an address, an address check circuit 216 analyses the generated address to determine whether it exceeds a predetermined maximum value. The predetermined maximum value may correspond to the maximum number of sub-carrier signals or pairs of sub-carrier signals, which are available for data symbols within the COFDM symbol, available for the mode which is being used. However, the 0.5k interleaver may also be used for other modes, so that the address generator 102 may also be used for the 1k mode, 2k mode, 4k mode, 8k mode, 16k mode and the 32k mode, by adjusting accordingly the number of the maximum valid address. However it will be understood that in order to support higher modes, the number of register stages shown in FIG. 5 may have to be increased.

If the generated address exceeds the predetermined maximum value then a control signal is generated by the address check unit 216 and fed via a connecting channel 220 to a control unit 224. If the generated address exceeds the predetermined maximum value then this address is rejected and a new address regenerated for the particular symbol.

For the 0.5k mode interleaver, an $(N_r-1)$ bit word $R'_i$ is defined, with $N_r=\log_2 M_{max}$, where $M_{max}=512$ using a LFSR (Linear Feedback Shift Register).

The polynomials used to generate this sequence is:

0.5k mode: $R'_i[7]=R'_{i-1}[0] \oplus R'_{i-1}[1] \oplus R'_{i-1}[5] \oplus R'_{i-1}[6]$ where i varies from 0 to $M_{max}-1$ Once one $R'_i$ word has been generated, the $R'_i$ word goes through a permutation to produce another $(N_r-1)$ bit word called $R_i$. $R_i$ is derived from $R'_i$ by the bit permutations given as follows:

| $R'_i$ bit positions | 7 | 6 | 5 | 4 | 3 | 2 | 1 | 0 |
|---|---|---|---|---|---|---|---|---|
| $R_i$ bit positions | 3 | 7 | 4 | 6 | 1 | 2 | 0 | 5 |

Bit permutation for the 0.5k mode interleaver

As an example, this means that for the mode 0.5k, the bit number 7 of $R'_i$ is sent in bit position number 3 of $R_i$.

The address $H(q)$ is then derived from $R_i$ through the following equation:

$$H(q) = (i \bmod 2) \cdot 2^{N_r-1} + \sum_{j=0}^{N_r-2} R_i(j) \cdot 2^j$$

The $(i \bmod 2) \cdot 2^{N_r-1}$ part of the above equation is represented in FIG. 5 by the toggle block T 218.

An address check is then performed on $H(q)$ to verify that the generated address is within the range of acceptable addresses: if $(H(q)<N_{max})$, where $N_{max}=378$ for example in a preferred example of the 0.5k mode, then the address is valid. If the address is not valid, the control unit is informed and it will try to generate a new $H(q)$ by incrementing the index i.

The role of the toggle block is to make sure that we do not generate an address exceeding $N_{max}$ twice in a row. In effect, if an exceeding value was generated, this means that the MSB (i.e. the toggle bit) of the address $H(q)$ was one. So the next value generated will have a MSB set to zero, insuring to produce a valid address.

The following equations sum up the overall behaviour and help to understand the loop structure of this algorithm:

$q = 0;$ for $(i = 0; i < M_{max}; i = i + 1)$ $$\left\{ \begin{array}{l} H(q) = (i \bmod 2) \cdot 2^{N_r-1} + \sum_{j=0}^{N_r-2} R_i(j) \cdot 2^j; \\ \text{if } (H(q) < N_{max}) \ q = q + 1; \end{array} \right\}$$

Analysis Supporting the Address Generator for the 0.5k Mode Interleaver

The selection of the polynomial generator and the permutation code explained above for the address generator 102 for the 0.5k mode interleaver has been identified following simulation analysis of the relative performance of the interleaver. The relative performance of the interleaver has been evaluated using a relative ability of the interleaver to separate successive symbols or an "interleaving quality". As mentioned above, effectively the interleaver must perform for both odd and even symbols, in order to use a single interleaver memory. The relative measure of the interleaver quality is determined by defining a distance D (in number of sub-carriers). A criterion C is chosen to identify a number of sub-carriers that are at distance≤D at the output of the interleaver that were at distance≤D at the input of the interleaver, the number of sub-carriers for each distance D then being weighted with respect to the relative distance. The criterion C is evaluated for both odd and even COFDM symbols. Minimising C produces a superior quality interleaver.

$$C = \sum_{1}^{d=D} N_{even}(d)/d + \sum_{1}^{d=D} N_{odd}(d)/d$$

where

Neven(d)=number of carriers from an even symbol separated by d at input and separated by less than 5 carriers at output.

Nodd(d)=number of carriers from an odd symbol separated by d at input and separated by less than 5 carriers apart at output.

Figure 6A:
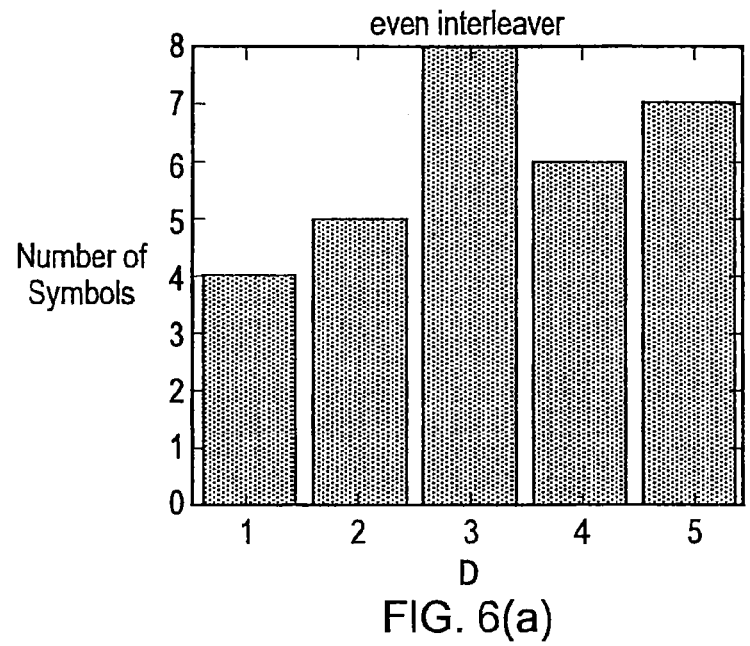
Figure 6B:
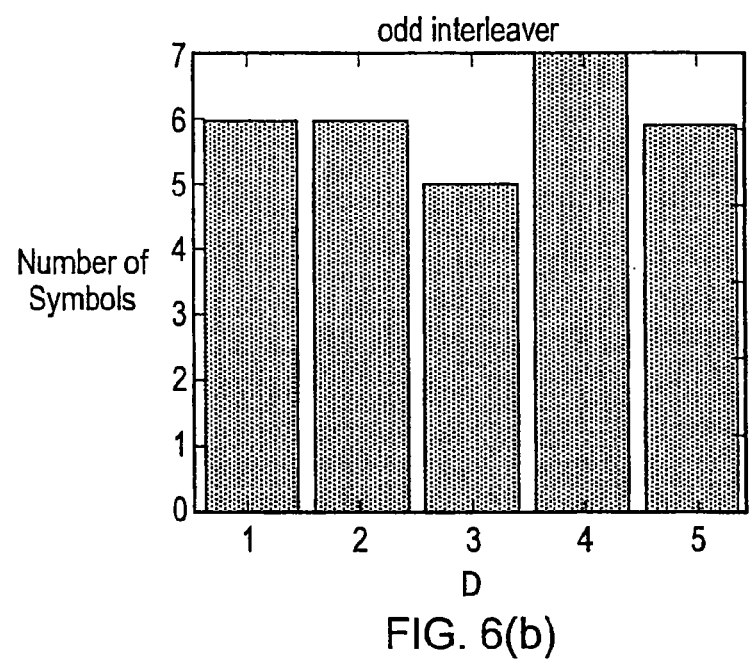

Analysis of the 0.5k interleaver identified above for the 0.5k mode for a value of D=5 is shown in FIG. 6(a) for the even COFDM symbols and in FIG. 6(b) for the odd COFDM symbol. According to the above analysis, the value of C for the permutation code identified above for the 0.5k mode produced a value of C=25.6833, that the weighted number of sub-carriers with symbols which are separated by five or less in the output according to the above equation was 25.6833.

Figure 6C:
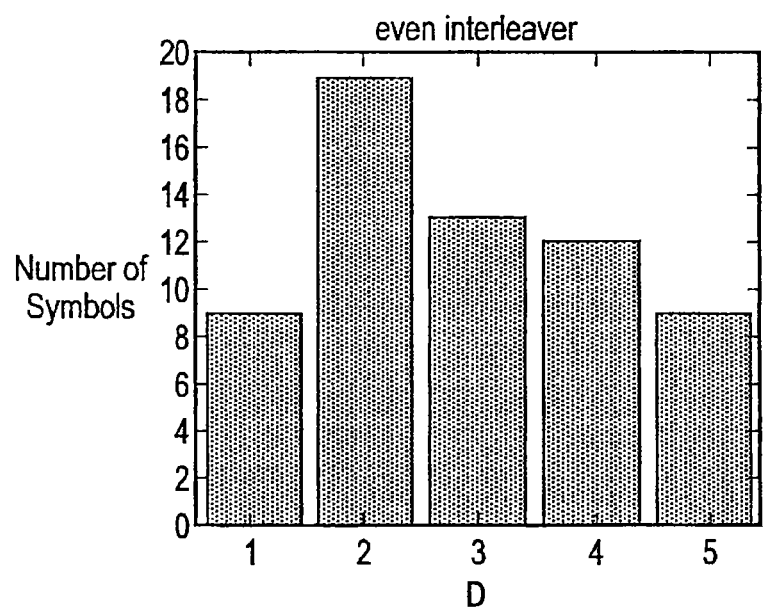
FIG. 6(c) is a diagram illustrating comparative results for an address generator using a different permutation code for even and FIG. 6(d) is a corresponding diagram for odd symbols.
Figure 6D:
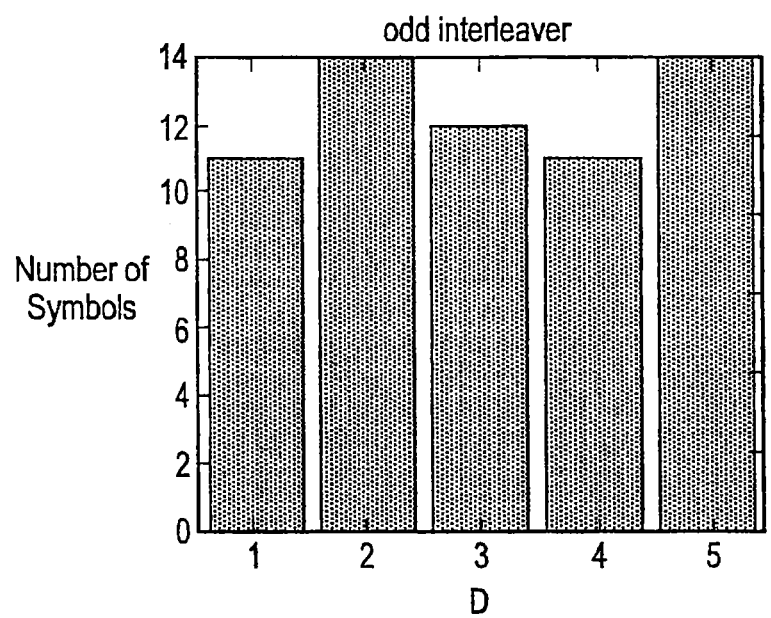

A corresponding analysis is provided for an alternative permutation code for even COFDM symbols in FIG. 6(c) for odd COFDM symbols in FIG. 6(d). As can be seen in comparison to the results illustrated in FIGS. 6(a) and 6(b), there are more components present which represent symbols separated by small distances such as D=1, and D=2, when compared with the results shown in FIGS. 6(a) and 6(b), illustrating that the permutation code identified above for the 0.5k mode symbol interleaver produces a superior quality interleaver.

Alternative Permutation Codes

The following seven alternative possible codes ($[n]R_i$ bit positions, where n=1 to 7) have been found to provide a symbol interleaver with a good quality as determined by the criterion C identified above.

| $R'_i$ bit positions | 7 | 6 | 5 | 4 | 3 | 2 | 1 | 0 |
|---|---|---|---|---|---|---|---|---|
| $[1]R_i$ bit positions | 3 | 7 | 4 | 5 | 1 | 2 | 0 | 6 |
| $[2]R_i$ bit positions | 3 | 5 | 4 | 7 | 1 | 2 | 0 | 6 |
| $[3]R_i$ bit positions | 6 | 7 | 2 | 5 | 1 | 4 | 0 | 3 |
| $[4]R_i$ bit positions | 3 | 2 | 5 | 6 | 1 | 7 | 0 | 4 |
| $[5]R_i$ bit positions | 4 | 2 | 5 | 7 | 3 | 0 | 1 | 6 |
| $[6]R_i$ bit positions | 4 | 3 | 7 | 1 | 6 | 0 | 2 | 5 |
| $[7]R_i$ bit positions | 3 | 7 | 6 | 4 | 1 | 2 | 0 | 5 |

Bit Permutation for the 0.5k Mode Interleaver

Receiver

FIG. 7 provides an example illustration of a receiver which may be used with the present technique. As shown in FIG. 7, a COFDM signal is received by an antenna 300 and detected by a tuner 302 and converted into a digital form by an analogue-to-digital converter 304. A guard interval removal processor 306 removes the guard interval from a received COFDM symbol, before the data is recovered from the COFDM symbol using a Fast Fourier Transform (FFT) processor 308 in combination with a channel estimator and correction 310 in co-operation with a embedded-signalling decoding unit 311, in accordance with known techniques. The demodulated data is recovered from a mapper 312 and fed to a symbol de-interleaver 314, which operates to effect the reverse mapping of the received data symbol to re-generate an output data stream with the data de-interleaved.

The symbol de-interleaver 314 is formed from a data processing apparatus as shown in FIG. 8 with an interleaver memory 540 and an address generator 542. The interleaver memory is as shown in FIG. 4 and operates as already explained above to effect de-interleaving by utilising sets of addresses generated by the address generator 542. The address generator 542 is formed as shown in FIG. 8 and is arranged to generate corresponding addresses to map the data symbols recovered from each COFDM sub-carrier signals into an output data stream.

The remaining parts of the COFDM receiver shown in FIG. 7 are provided to effect bit de-interleaving 316 and error correction decoding 318 to correct errors and recover an estimate of the source data.

One advantage provided by the present technique for both the receiver and the transmitter is that a symbol interleaver and a symbol de-interleaver operating in the receivers and transmitters can be switched between the 0.5k, 1k, 2k, 4k, 8k, 16k and the 32k mode by changing the generator polynomials and the permutation order. Hence the address generator 542 shown in FIG. 8 includes an input 544, providing an indication of the mode as well as an input 546 indicating whether there are odd/even COFDM symbols. A flexible implementation is thereby provided because a symbol interleaver and de-interleaver can be formed as shown in FIGS. 3 and 8, with an address generator as illustrated in FIG. 5. However, it will be understood that to support an interleaver for a higher order mode, the linear feedback register 200 would require more than eight register stages. For example in order to support a 4k mode, ten register stages would be required to provide for 2048 sub-carrier addresses The address generator can be adapted to the different modes by changing to the generator polynomials and the permutation orders indicated for each of the modes. For example, this can be effected using a software change. Alternatively, in other embodiments, an embedded signal indicating the mode of the DVB-T2 transmission can be detected in the receiver in the embedded-signalling processing unit 311 and used to configure automatically the symbol de-interleaver in accordance with the detected mode.

Optimal Use of Odd Interleavers

As shown in FIG. 4, two symbol interleaving processes, one for even symbols and one for odd symbols allows the amount of memory used during interleaving to be reduced. In the example shown in FIG. 4, the write in order for the odd symbol is the same as the read out order for the even symbol therefore while an odd symbol is being read from the memory, an even symbol can be written to the location just read from; subsequently, when that even symbol is read from the memory, the following odd symbol can be written to the location just read from.

Figure 9A:
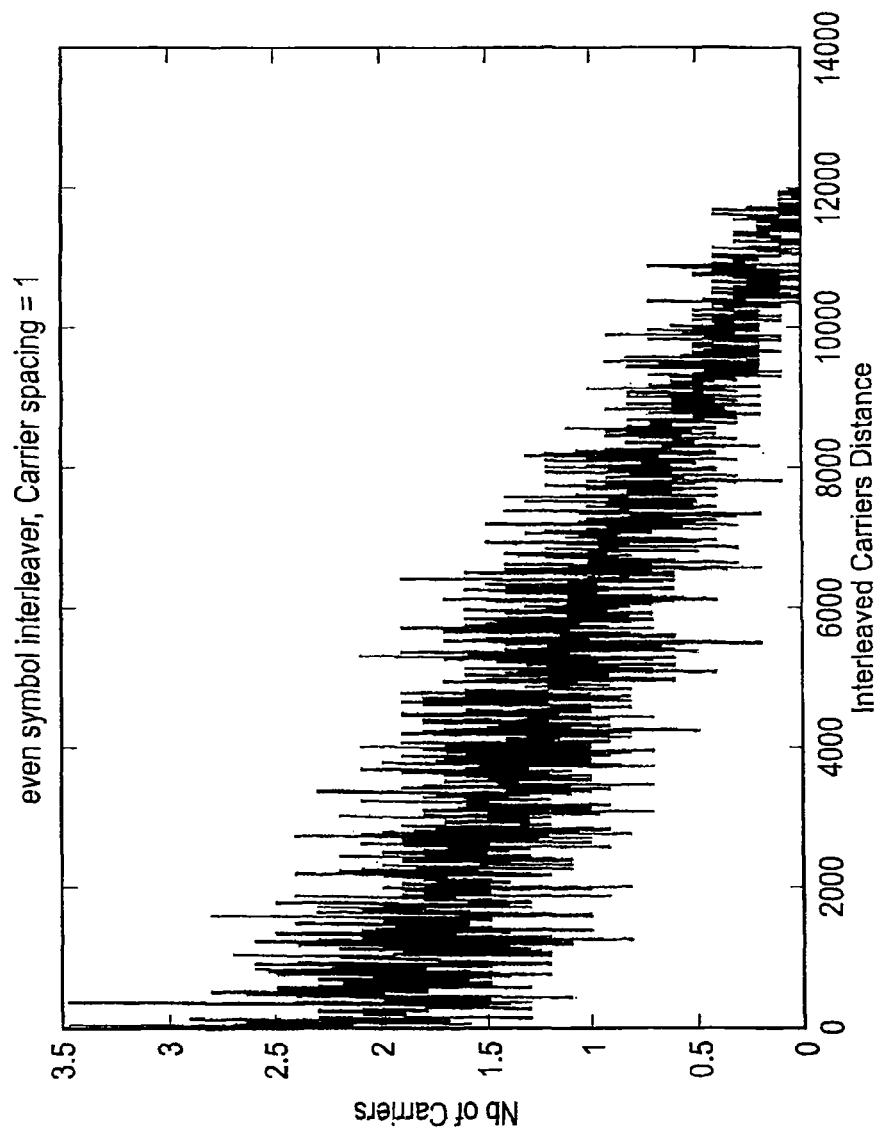
FIG. 9(a) is diagram illustrating results for an interleaver for even OFDM symbols and FIG. 9(b) is a diagram illustrating results for odd OFDM symbols.
Figure 9B:
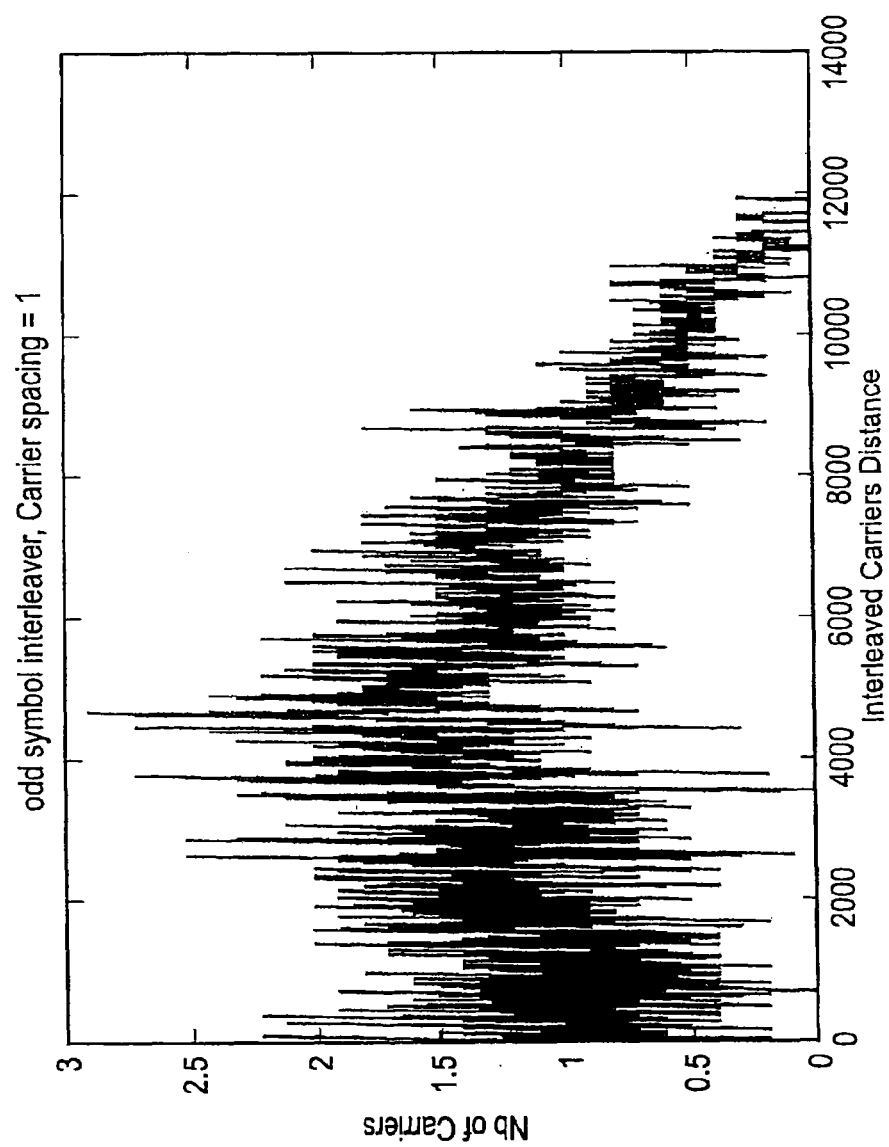
Figure 10:
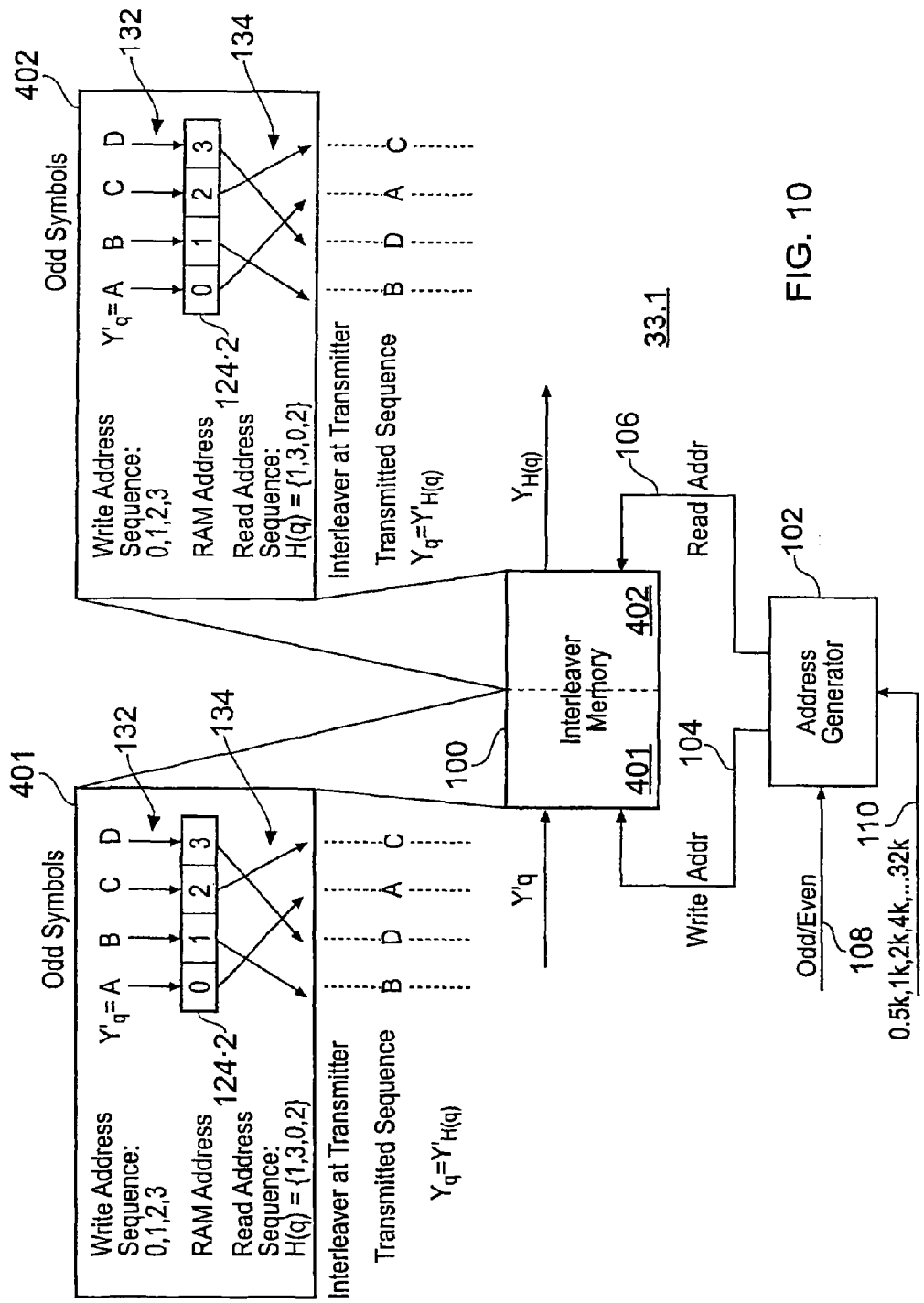
FIG. 10 provides a schematic block diagram of the symbol interleaver shown in FIG. 3, illustrating an operating mode in which interleaving is performed in accordance with an odd interleaving mode only.
Figure 11:
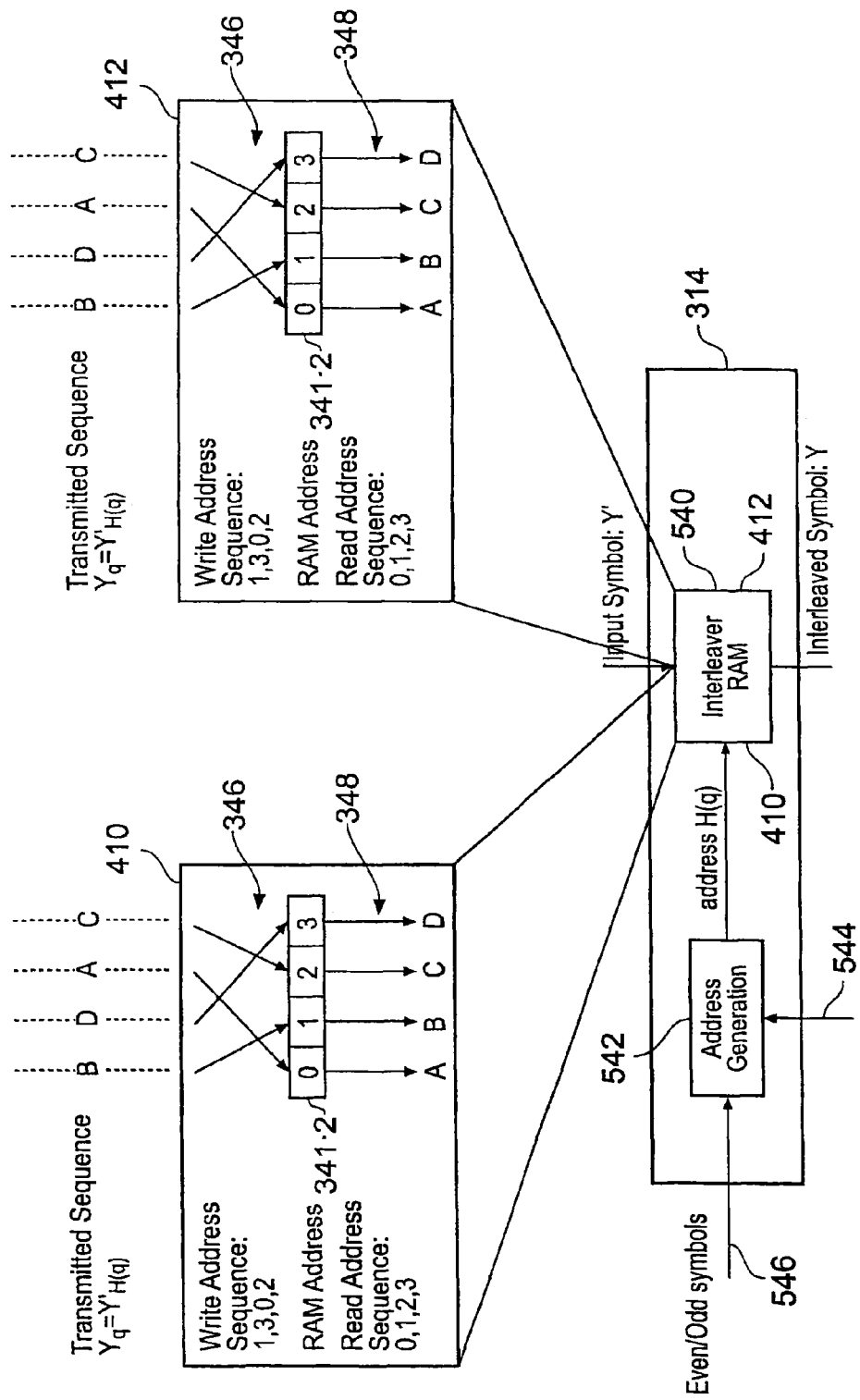
FIG. 11 provides a schematic block diagram of the symbol de-interleaver shown in FIG. 8, illustrating the operating mode in which interleaving is performed in accordance with the odd interleaving mode only.

As discussed above, during analysis and for example shown in FIG. 9(a) and FIG. 9(b) it has been shown that the interleaving schemes designed for the 2k and 8k symbol interleavers for DVB-T and the 4k symbol interleaver for DVB-H work better for odd symbols than even symbols. This can be seen by comparing FIG. 9(a) which shows results for an interleaver for even symbols and FIG. 6(b) illustrating results for odd symbols: it can be seen that the average distance at the interleaver output of sub-carriers that were adjacent at the interleaver input is greater for an interleaver for odd symbols than an interleaver for even symbols.

As will be understood, the amount of interleaver memory required to implement a symbol interleaver is dependent on the number of data symbols to be mapped onto the COFDM carrier symbols. Thus a 16k mode symbol interleaver requires half the memory required to implement a 32k mode symbol interleaver and similarly, the amount of memory required to implement an 8k symbol interleaver is half that required to implement a 16k interleaver. Therefore for a transmitter or receiver that can implement a symbol interleaver of a given mode, that receiver or transmitter will include sufficient memory to implement two odd interleaving processes for a mode half or smaller than that given mode. For example a receiver or transmitter including a 32k interleaver will have enough memory to accommodate two 16k odd interleaving processes each with their own 16k memory.

Therefore, in order to address the fact that even interleaving processes appear not to perform as well as odd interleaving processes a symbol interleaver capable of accommodating multiple modulation modes can be arranged so that only an odd symbol interleaving process is used if in a mode which comprises half or less of the number of carriers in the maximum mode. For example in a transmitter/receiver capable of the 32k mode, when operating in a mode with fewer carriers (i.e. 16k, 8k, 4k or 1k) then rather than employing separate odd and even symbol interleaving 5 processes, two odd interleavers would be used.

Odd Interleaver with Offset

The performance of an interleaver, which uses two odd interleavers could be further improved by using a sequence of odd only interleavers rather than a single odd only interleaver, so that any bit of data input to the interleave does not always modulate the same carrier in the OFDM symbol.

A sequence of odd only interleavers could be realised by either:

adding an offset to the interleaver address modulo the number of data carriers, or using a sequence of permutations in the interleaver Adding an Offset Adding an offset to the interleaver address modulo the number of data carriers effectively shifts and wraps-round the OFDM symbol so that any bit of data input to the interleaver does not always modulate the same carrier in the OFDM symbol.

The offset would change each symbol. For example, this offset could provide be a cyclic sequence. This cyclic sequence could be, for example, of length 4 and could consist of for example, prime numbers. For example, such a sequence could be:

0, 41, 97, 157

Furthermore, the offset may be a random sequence, which may be generated by another address generator from a similar OFDM symbol interleaver or may be generated by some other means.

Using a Sequence of Permutations

Using a sequence of permutations in the interleaver would ensure that any bit of data input to the interleaver does not always modulate the same carrier in the OFDM symbol.

For example, this could be a cyclic sequence. This cyclic sequence could be, for example, of length 4.

For example, such a sequence for a "1k symbol interleaver" could be:

4 3 2 1 0 5 6 7 8
3 2 5 0 1 4 7 8 6
7 5 3 8 2 6 1 4 0
1 6 8 2 5 3 4 0 7

For example, such a sequence for a "16k symbol interleaver" could be:

8 4 3 2 0 11 1 5 12 10 6 7 9
7 9 5 3 11 1 4 0 2 12 10 8 6
6 11 7 5 2 3 0 1 10 8 12 9 4
5 12 9 0 3 10 2 4 6 7 8 11 1

Other combinations of sequences may be possible for 2k, 4k and 8k carrier modes or indeed 0.5k carrier mode. For example, the following permutation codes for each of the 0.5k, 2k, 4k and 8k provide good de-correlation of symbols and can be used cyclically to generate the offset to the address generated by an address generator for each of the respective modes:

2k Mode:
0 7 5 1 8 2 6 9 3 4 *
  *these are the permutations in the DVB-T standard
4 8 3 2 9 0 1 5 6 7
8 3 9 0 2 1 5 7 4 6
7 0 4 8 3 6 9 1 5 2

4k Mode:
7 10 5 8 1 2 4 9 0 3 6 **
  **these are the permutations in the DVB-H standard
6 2 7 10 8 0 3 4 1 9 5
9 5 4 2 3 10 1 0 6 8 7
1 4 10 3 9 7 2 6 5 0 8

8k Mode:
5 11 3 0 10 8 6 9 2 4 1 7*
  *these are the permutations in the DVB-T standard
10 8 5 4 2 9 1 0 6 7 3 11
11 6 9 8 4 7 2 1 0 10 5 3
8 3 1 17 9 15 6 4 0 2 10

In addition, some further sequences of four permutation codes, which are cycled through to provide the offset in an address generator to produce a good de-correlation in the interleaved symbols (some are common to the above) are provided below:

0.5k Mode:
3 7 4 6 1 2 0 5
4 2 5 7 3 0 1 6
5 3 6 0 4 1 2 7
6 1 0 5 2 7 4 3

2k Mode:
0 7 5 1 8 2 6 9 3 4*
  *these are the permutations in the DVB-T standard
3 2 7 0 1 5 8 4 9 6
4 8 3 2 9 0 1 5 6 7
7 3 9 5 2 1 0 6 4 8

4k Mode:
7 10 5 8 1 2 4 9 0 3 6 **
  **these are the permutations in the DVB-H standard
6 2 7 10 8 0 3 4 1 9 5
10 3 4 1 2 7 0 6 8 5 9
0 8 9 5 10 4 6 3 2 1 7

8k Mode:
5 11 3 0 10 8 6 9 2 4 1 7 *
  *these are the permutations in the DVB-T standard
8 10 7 6 0 5 2 1 3 9 4 11
11 3 6 9 2 7 4 10 5 1 0 8
10 8 1 7 5 6 0 11 4 2 9 3

Examples of address generators, and corresponding interleavers, for the 2k, 4k and 8k modes are disclosed in European patent application number 04251667.4, the contents of which are incorporated herein be reference. An address generator for the 0.5k mode are disclosed in our co-pending UK patent application filed under D Young & Co's reference 0722553.5.

Various modifications may be made to the embodiments described above without departing from the scope of the present invention. In particular, the example representation of the generator polynomial and the permutation order which have been used to represent aspects of the invention are not intended to be limiting and extend to equivalent forms of the generator polynomial and the permutation order.

As will be appreciated the transmitter and receiver shown in FIGS. 1 and 7 respectively are provided as illustrations only and are not intended to be limiting. For example, it will be appreciated that the position of the symbol interleaver and the de-interleaver with respect, for example to the bit interleaver and the mapper can be changed. As will be appreciated the effect of the interleaver and de-interleaver is un-changed by its relative position, although the interleaver may be interleaving I/Q symbols instead of v-bit vectors. A corresponding change may be made in the receiver. Accordingly the interleaver and de-interleaver may be operating on different data types, and may be positioned differently to the position described in the example embodiments.

As explained above the permutation codes and generator polynomial of the interleaver, which has been described with reference to an implementation of a particular mode, can equally be applied to other modes, by changing the predetermined maximum allowed address in accordance with the number of sub-carriers for that mode.

As mentioned above, embodiments of the present invention find application with DVB standards such as DVB-T and DVB-H, which are incorporated herein by reference. For example embodiments of the present invention may be used in a transmitter or receiver operating in accordance with the DVB-H standard, in hand-held mobile terminals. The mobile terminals may be integrated with mobile telephones (whether second, third or higher generation) or Personal Digital Assistants or Tablet PCs for example. Such mobile terminals may be capable of receiving DVB-H or DVB-T compatible signals inside buildings or on the move in for example cars or trains, even at high speeds. The mobile terminals may be, for example, powered by batteries, mains electricity or low voltage DC supply or powered from a car battery. Services that may be provided by DVB-H may include voice, messaging, internet browsing, radio, still and/or moving video images, television services, interactive services, video or near-video on demand and option. The services might operate in combination with one another. It will be appreciated that the present invention is not limited to application with DVB and may be extended to other standards for transmission or reception, both fixed and mobile.

The invention claimed is:

1. A transmitter for transmitting input symbols by mapping the input symbols to be transmitted onto a predetermined number of sub-carrier signals of an Orthogonal Frequency Division Multiplexed (OFDM) symbol, the transmitter comprising:

an interleaver configured to read-into a memory the predetermined number of data symbols arranged into pairs of data symbols for mapping onto pairs of said OFDM sub-carrier signals, the predetermined number of pairs of OFDM sub-carriers symbols being dependent on a first OFDM operating mode and to read-out of the memory the data symbols for the pairs of OFDM sub-carriers to effect the mapping, the read-out being in a different order than the read-in, the order being determined from a set of addresses, with the effect that the data symbols are interleaved on the pairs of sub-carrier signals, and an address generator configured to generate the set of addresses, the addresses being generated for the input symbols to indicate the pairs of OFDM sub-carrier signals onto which the pairs of data symbols are to be mapped, the address generator comprising:

a linear feedback shift register including a predetermined number of register stages and being configured to generate a pseudo-random bit sequence in accordance with a generator polynomial configured according to the first OFDM operating mode, a permutation circuit configured to receive the content of the shift register stages and to permute the bits present in the register stages in accordance with a permutation order to form an address of one of the pairs of OFDM sub-carriers, and a control unit configured in combination with an address check circuit to re-generate an address when a generated address exceeds a predetermined maximum valid address determined according to said first OFDM operating mode, wherein the address generator includes an offset generator configured to add an offset to the generated address.

2. The transmitter as claimed in claim 1, wherein the pairs of interleaved data symbols are configured for transmission in a second OFDM operating mode.

3. The transmitter as claimed in claim 1, wherein the offset generator is configured to generate the offset using an address generator configured for another of a plurality of operating modes.

4. The transmitter as claimed in claim 1, wherein the generator polynomial is selected according to the first OFDM operating mode.

5. The transmitter as claimed in claim 1, wherein the permutation order of the permutation circuit is selected according to the first OFDM operating mode.

6. The transmitter as claimed in claim 2, wherein the predetermined number of pairs of sub-carriers of the first OFDM operating mode is half of a predetermined number of sub-carriers of the second OFDM operating mode.

7. The transmitter as claimed in claim 2, wherein the permutation order is configured to operate for the first OFDM operating mode when the pairs of interleaved data symbols are configured for transmission in the second OFDM operating mode.

8. The transmitter as claimed in claim 6, wherein the first OFDM operating mode is one of a 0.5k, 1k, 2k, 4k, 8k or 16k OFDM operating mode, and wherein the second OFDM operating mode is one of a 1k, 2k, 4k, 8k or 32k OFDM operating mode respective to the first OFDM operating mode.

9. A method of transmitting input symbols by mapping the input symbols to be transmitted onto a predetermined number of sub-carrier signals of an Orthogonal Frequency Division Multiplexed (OFDM) symbol, the method comprising:

reading-into a memory the predetermined number of data symbols arranged into pairs of data symbols for mapping onto pairs of said OFDM sub-carrier signals, the predetermined number of pairs of OFDM sub-carriers symbols being dependent on a first OFDM operating mode and reading-out of the memory the data symbols for the pairs of OFDM sub-carriers to effect the mapping, the read-out being in a different order than the read-in, the order being determined from a set of addresses, with the effect that the data symbols are interleaved on the pairs of sub-carrier signals, and generating the set of addresses, the addresses being generated for the input symbols to indicate the pairs of OFDM sub-carrier signals onto which the pairs of data symbols are to be mapped, the generating the set of addresses comprising:

using a linear feedback shift register including a predetermined number of register stages to generate a pseudo-random bit sequence in accordance with a generator polynomial selected according to the first OFDM operating mode, using a permutation circuit configured to receive the content of the shift register stages and permuting the bits present in the register stages in accordance with a permutation order to form an address of one of the pairs of OFDM sub-carriers, and re-generating an address when a generated address exceeds a predetermined maximum valid address determined according to said first OFDM operating mode, and adding an offset to the generated address.

10. The method as claimed in claim 9, wherein the pairs of interleaved data symbols are configured for transmission in a second OFDM operating mode.

11. The method as claimed in claim 9, wherein the offset generator is configured to generate the offset using an address generator configured for another of a plurality of operating modes.

12. The method as claimed in claim 9, comprising selecting the generator polynomial according to the first OFDM operating mode.

13. The method as claimed in claim 9, comprising selecting the permutation order of the permutation circuit according to the first OFDM operating mode.

14. The method as claimed in claim 10, wherein the predetermined number of pairs of subcarriers sub-carriers of the first OFDM operating mode is half a predetermined number of sub-carriers of the second OFDM operating mode.

15. The method as claimed in claim 10, wherein the permutation order is configured to operate for the first OFDM operating mode when the pairs of interleaved data symbols are configured for transmission in the second OFDM operating mode.

16. The method as claimed in claim 14, wherein the first OFDM operating mode is one of a 0.5k, 1k, 2k, 4k, 8k or 16k OFDM operating mode, and wherein the second OFDM operating mode is one of a 1k, 2k, 4k, 8k or 32k OFDM operating mode respective to the first OFDM operating mode.

* * * * *